US011043474B2

(12) United States Patent
Tsuchimochi et al.

(10) Patent No.: US 11,043,474 B2
(45) Date of Patent: Jun. 22, 2021

(54) SEMICONDUCTOR DEVICE

(71) Applicant: DENSO CORPORATION, Kariya (JP)

(72) Inventors: Shingo Tsuchimochi, Nagakute (JP); Rintaro Asai, Nisshin (JP); Akinori Sakakibara, Toyota (JP); Masao Noguchi, Nagakute (JP)

(73) Assignee: DENSO CORPORATION, Kariya (JP)

( * ) Notice: Subject to any disclaimer, the term of this patent is extended or adjusted under 35 U.S.C. 154(b) by 162 days.

(21) Appl. No.: 16/396,822

(22) Filed: Apr. 29, 2019

(65) Prior Publication Data

US 2019/0385985 A1  Dec. 19, 2019

(30) Foreign Application Priority Data

Jun. 13, 2018 (JP) .............................. JP2018-112785

(51) Int. Cl.
*H01L 25/07* (2006.01)
*H01L 23/498* (2006.01)
*H01L 23/31* (2006.01)

(52) U.S. Cl.
CPC ........ *H01L 25/072* (2013.01); *H01L 23/3121* (2013.01); *H01L 23/49833* (2013.01)

(58) Field of Classification Search
CPC ............. H01L 25/072; H01L 23/49833; H01L 23/3121; H01L 27/072
See application file for complete search history.

(56) References Cited

U.S. PATENT DOCUMENTS

| 2007/0267739 | A1 | 11/2007 | Kajiwara et al. |
| 2014/0217596 | A1 | 8/2014 | Otremba et al. |
| 2014/0225124 | A1 | 8/2014 | Otremba et al. |

FOREIGN PATENT DOCUMENTS

| JP | 4967447 B2 | 7/2012 |
| JP | 2012-146760 A | 8/2012 |
| WO | 2012/096066 A1 | 7/2012 |
| WO | WO2012096066 A1 * | 7/2012 |

* cited by examiner

*Primary Examiner* — Hoang-Quan Ho
(74) *Attorney, Agent, or Firm* — Oliff PLC (57) ABSTRACT

A semiconductor device may include a first insulated substrate, a first semiconductor chip and a second semiconductor chip disposed on the first insulated substrate, a second insulated substrate opposed to the first insulated substrate with the first semiconductor chip interposed therebetween, and a third insulated substrate opposed to the first insulated substrate with the second semiconductor chip interposed therebetween and located side by side with the second insulated substrate.

16 Claims, 6 Drawing Sheets

SEMICONDUCTOR DEVICE

CROSS-REFERENCE

This application claims priority to Japanese Patent Application No. 2018-112785, filed on Jun. 13, 2018, the entire contents of which are incorporated herein by reference.

TECHNICAL FIELD

A technology disclosed herein relates to a semiconductor device.

BACKGROUND

Japanese Patent Application Publication No. 2012-146760 describes a semiconductor device. This semiconductor device includes two insulated substrates and two semiconductor chips provided between the insulated substrates. The two semiconductor chips are connected in series and can constitute a pair of upper and lower arms in a power conversion circuit such as an inverter or a converter. Here, an insulated substrate refers to a substrate for power in which conductor layers, such as metal layers, are provided on both surfaces of an insulator layer such as a ceramic substrate. Typical examples of such insulated substrates include a Direct Bonded Copper (DBC) substrate and a Direct Bonded Aluminum (DBA) substrate, although not particularly limited thereto.

SUMMARY

The above-described semiconductor device adopts a relatively complicated configuration in which the two semiconductor chips are connected via the two insulated substrates and power terminals. With a semiconductor device including a complicated configuration, a power loss in the semiconductor device as well as a cost of manufacturing the semiconductor device may increase. In view of this, the disclosure herein provides a technology capable of simplifying a configuration of a semiconductor device that includes two semiconductor chips connected in series.

A semiconductor device disclosed herein may comprise a first insulated substrate, a first semiconductor chip and a second semiconductor chip disposed on the first insulated substrate, a second insulated substrate opposed to the first insulated substrate with the first semiconductor chip interposed therebetween, and a third insulated substrate opposed to the first insulated substrate with the second semiconductor chip interposed therebetween and located side by side with the second insulated substrate. The first insulated substrate may comprise a first insulator layer, a first inner conductor layer provided on one side of the first insulator layer and electrically connected to the first semiconductor chip and the second semiconductor chip, and a first outer conductor layer provided on another side of the first insulator layer. The second insulated substrate may comprise a second insulator layer, a second inner conductor layer provided on one side of the second insulator layer and electrically connected to the first semiconductor chip, and a second outer conductor layer provided on another side of the second insulator layer. The third insulated substrate may comprise a third insulator layer, a third inner conductor layer provided on one side of the third insulator layer and electrically connected to the second semiconductor chip, and a third outer conductor layer provided on another side of the third insulator layer.

In the above-described semiconductor device, the first semiconductor chip and the second semiconductor chip are connected in series between the second insulated substrate and the third insulated substrate. The first semiconductor chip and the second semiconductor chip are connected via the first inner conductor layer of the first insulated substrate, and there is no other insulated substrate or power terminal on a path that connects the two semiconductor chips. Accordingly, a circuit structure in the semiconductor device is simplified, and a power loss in the semiconductor device can be reduced, for example. The second insulated substrate and the third insulated substrate, which are located side by side, may be replaced with a single insulated substrate. However, since a relatively large voltage could be applied between the second insulated substrate and the third insulated substrate, adopting the second insulated substrate and the third insulated substrate which are independent of each other can enhance insulation more effectively than adopting a single insulated substrate.

DETAILED DESCRIPTION

In an embodiment of the present technology, a size of the second insulated substrate may be equal to or different from a size of the third insulated substrate. For example, the size of the second insulated substrate may be smaller than the size of the third insulated substrate. Alternatively, the size of the second insulated substrate may be larger than the size of the third insulated substrate. Each of the sizes of the second insulated substrate and the third insulated substrate can be designed as appropriate in accordance with, for example, structures of the first semiconductor chip and the second semiconductor chip.

In an embodiment of the present technology, the semiconductor device may further comprise an encapsulant encapsulating the first semiconductor chip and the second semiconductor chip. In this case, the first inner conductor layer of the first insulated substrate may be soldered directly to the first semiconductor chip and the second semiconductor chip. The second inner conductor layer of the second insulated substrate may be soldered directly to the first semiconductor chip. The third inner conductor layer of the third insulated substrate may be soldered directly to the second semiconductor chip.

In an embodiment of the present technology, each of the first semiconductor chip and the second semiconductor chip may be a switching element including a front electrode and a back electrode and configured to electrically connect and disconnect the front electrode and the back electrode. In this case, the front electrode of the first semiconductor chip may be electrically connected to the first inner conductor layer of the first insulated substrate. The back electrode of the first semiconductor chip may be electrically connected to the second inner conductor layer of the second insulated substrate. The front electrode of the second semiconductor chip may be electrically connected to the third inner conductor layer of the third insulated substrate. The back electrode of the second semiconductor chip may be electrically connected to the first inner conductor layer of the first insulated substrate. According to such a configuration, the semiconductor device can constitute a pair of upper and lower arms in a power conversion circuit such as an inverter or a converter. As another embodiment, instead of or in addition to being the switching element, the first semiconductor chip and/or the second semiconductor chip may be a power semiconductor chip of another type, such as a diode element.

In an embodiment of the present technology, each of the above-described switching elements may be an Insulated Gate Bipolar Transistor (IGBT). In this case, the front electrode may be an emitter electrode, and the back electrode may be a collector electrode. Alternatively, each of the above-described switching elements may be a Metal-Oxide-Semiconductor Field-Effect Transistor (MOSFET). In this case, the front electrode may be a source electrode, and the back electrode may be a drain electrode.

In the above-described embodiment, each of the first semiconductor chip and the second semiconductor chip may further comprise a signal electrode provided on a side thereof where the front electrode is provided. In this case, the first inner conductor layer of the first insulated substrate may comprise a main region and a signal region that are separated from each other on the first insulator layer. The main region may be electrically connected to the front electrode of the first semiconductor chip and the back electrode of the second semiconductor chip, and the signal region may be electrically connected to the signal electrode of the first semiconductor chip.

In the above-described embodiment, the first inner conductor layer of the first insulated substrate may further comprise a floating region electrically insulated from the first semiconductor chip and the second semiconductor chip. In this case, the floating region may be located close to an outer edge of the first insulator layer such that the signal region is located between the main region and the floating region. In the first insulated substrate, a reduction in symmetry between the first inner conductor layer and the first outer conductor layer may cause an increase in thermal deformation (warpage, in particular) in the first insulated substrate. In particular, since the first inner conductor layer is provided partly in a region that includes the signal region, the symmetry between the first inner conductor layer and the first outer conductor layer is likely to reduce. In this regard, with the above-described floating region provided, the symmetry between the first inner conductor layer and the first outer conductor layer can be effectively improved, and the thermal deformation in the first insulated substrate can be suppressed. Here, the floating region is electrically insulated from the first semiconductor chip and the second semiconductor chip, and hence has small influence on electrical properties of the semiconductor device.

In the above-described embodiment, a dummy terminal may be joined on the floating region. According to such a configuration, when the semiconductor device is manufactured, for example, positioning for the first insulated substrate can be performed by using the dummy terminal. In particular, by preparing the dummy terminal together with other terminals, such as signal terminals, integrally in a single lead frame, the first insulated substrate can be positioned with respect to these terminals.

In the above-described embodiment, in a plan view of the first insulated substrate, a part of an outer edge of the floating region may overlap an outer edge of the first outer conductor layer. According to such a configuration, the symmetry between the first inner conductor layer and the first outer conductor layer improves, so the thermal deformation in the first insulated substrate can be suppressed.

In an embodiment of the present technology, the third inner conductor layer of the third insulated substrate may comprise a main region and a signal region that are separated from each other on the third insulator layer. In this case, the main region of the third inner conductor layer may be electrically connected to the front electrode of the second semiconductor chip, and the signal region of the third inner conductor layer may be electrically connected to the signal electrode of the second semiconductor chip.

In the above-described embodiment, the third inner conductor layer of the third insulated substrate may further comprise a floating region electrically insulated from the first semiconductor chip and the second semiconductor chip. In this case, in the third insulated substrate, the floating region may be located close to an outer edge of the third insulator layer such that the signal region is located between the main region and the floating region. According to such a configuration, as in the case of the first insulated substrate described above, thermal deformation in the third insulated substrate can be suppressed.

In an embodiment of the present technology, the semiconductor device may further comprise a first power terminal joined on the first inner conductor layer of the first insulated substrate between the first insulated substrate and the third insulated substrate. In this case, the third inner conductor layer may not be provided within a region of the third insulated substrate that is opposed to the first power terminal. According to such a configuration, a short circuit between the first power terminal and the third inner conductor layer of the third insulated substrate can be avoided.

In an embodiment of the present technology, the semiconductor device may further comprise a second power terminal joined on the second inner conductor layer of the second insulated substrate between the first insulated substrate and the second insulated substrate. In this case, the first inner conductor layer may not be provided within a region of the first insulated substrate that is opposed to the second power terminal. According to such a configuration, a short circuit between the second power terminal and the first inner conductor layer of the first insulated substrate can be avoided.

In an embodiment of the present technology, the semiconductor device may further comprise a third power terminal joined on the third inner conductor layer of the third insulated substrate between the first insulated substrate and the third insulated substrate. In this case, the first inner conductor layer may not be provided within a region of the first insulated substrate that is opposed to the third power terminal. According to such a configuration, a short circuit between the third power terminal and the first inner conductor layer of the first insulated substrate can be avoided.

In the above-described embodiment, the third power terminal may include a bending portion bending along a direction parallel to the third insulated substrate. In this case, the bending portion may be located within the encapsulant. According to such a configuration, the third power terminal is firmly fixed by an anchor effect provided by the bending portion. A similar bending portion may be adopted for other terminals, such as the first power terminal and the second power terminal, in a similar manner.

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENT

With reference to the drawings, a semiconductor device 10 in an embodiment will be described. The semiconductor device 10 can be adopted, for example, for a power controller of an electric vehicle, and can constitute at least a part of a power conversion circuit such as a converter or an inverter. The electric vehicle herein widely refers to vehicles including a motor that drives wheels, and examples thereof include an electric vehicle charged with external power, a hybrid vehicle that includes an engine in addition to a motor, a fuel-cell vehicle powered by a fuel cell, and the like.

As shown in FIGS. 1 to 4, the semiconductor device 10 includes a first semiconductor chip 12, a second semiconductor chip 14, and an encapsulant 16. The first semiconductor chip 12 and the second semiconductor chip 14 are encapsulated within the encapsulant 16. The encapsulant 16 is constituted of an insulating material. The encapsulant 16 in the present embodiment is constituted of thermosetting resin such as epoxy resin, although not particularly limited thereto. The encapsulant 16 has a substantially plate shape and includes a front surface 16a and a back surface 16b located opposite to the front surface 16a.

The first semiconductor chip 12 includes a front electrode 12a, a back electrode 12b, and a plurality of signal electrodes 12c. The front electrode 12a and the plurality of signal electrodes 12c are located on a front surface of the first semiconductor chip 12, whereas the back electrode 12b is located on a back surface of the first semiconductor chip 12. The first semiconductor chip 12 is a switching element configured to electrically connect and disconnect the front electrode 12a and the back electrode 12b. Although not particularly limited, the first semiconductor chip 12 in the present embodiment is an Insulated Gate Bipolar Transistor (IGBT), the front electrode 12a is an emitter electrode and the back electrode 12b is a collector electrode. Moreover, the first semiconductor chip 12 is provided with a freewheeling diode 12d therein in addition to the IGBT. As another embodiment, the first semiconductor chip 12 may be a Metal-Oxide-Semiconductor Field-Effect Transistor (MOSFET). In this case, the front electrode 12a may be a source electrode and the back electrode 12b may be a drain electrode.

Similarly, the second semiconductor chip 14 includes a front electrode 14a, a back electrode 14b, and a plurality of signal electrodes 14c. The front electrode 14a and the plurality of signal electrodes 14c are located on a front surface of the second semiconductor chip 14, whereas the back electrode 14b is located on a back surface of the second semiconductor chip 14. The second semiconductor chip 14 is a switching element configured to electrically connect and disconnect the front electrode 14a and the back electrode 14b. Although not particularly limited, the second semiconductor chip 14 in the present embodiment is an IGBT, the front electrode 14a is an emitter electrode and the back electrode 14b is a collector electrode. Moreover, the second semiconductor chip 14 is also provided with a freewheeling diode 14d therein in addition to the IGBT. The second semiconductor chip 14 may also be a MOSFET, and the front electrode 12a may be a source electrode and the back electrode 12b may be a drain electrode.

The first semiconductor chip 12 and the second semiconductor chip 14 in the present embodiment have a same structure and are disposed with their orientations reversed to each other, although not particularly limited. As another embodiment, the first semiconductor chip 12 and the second semiconductor chip 14 may have different structures from each other. For example, the first semiconductor chip 12 and the second semiconductor chip 14 may be switching elements having different structures from each other. Alternatively, the first semiconductor chip 12 may be a switching element and the second semiconductor chip 14 may be a diode element. For the first semiconductor chip 12 and the second semiconductor chip 14, various types of power semiconductor elements can be adopted.

Figure 2:
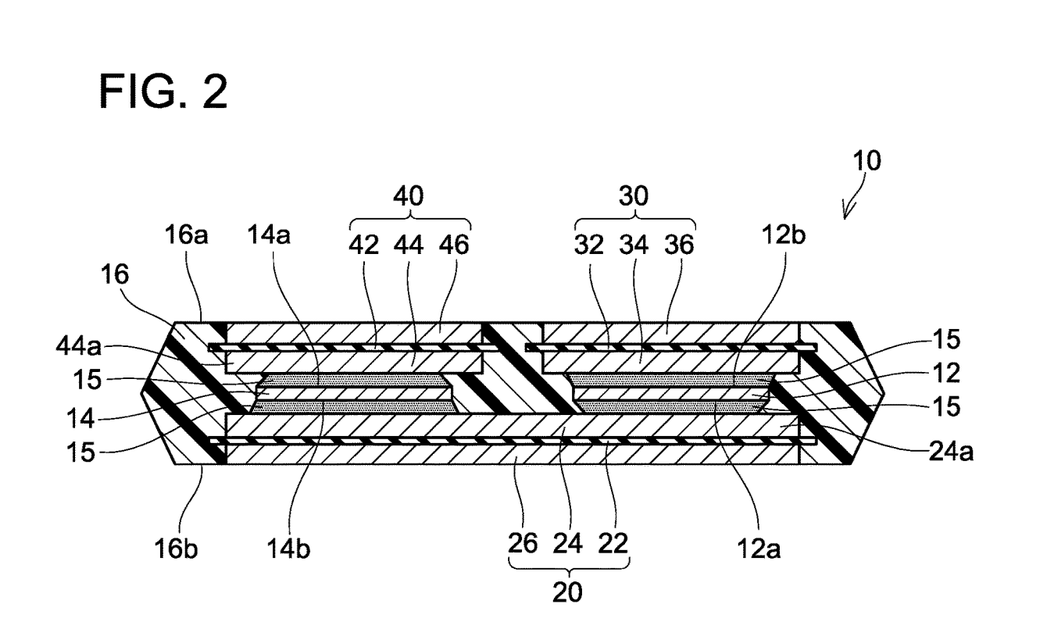
FIG. 2 shows a cross-sectional view along a line II-II in FIG. 1.
Figure 3:
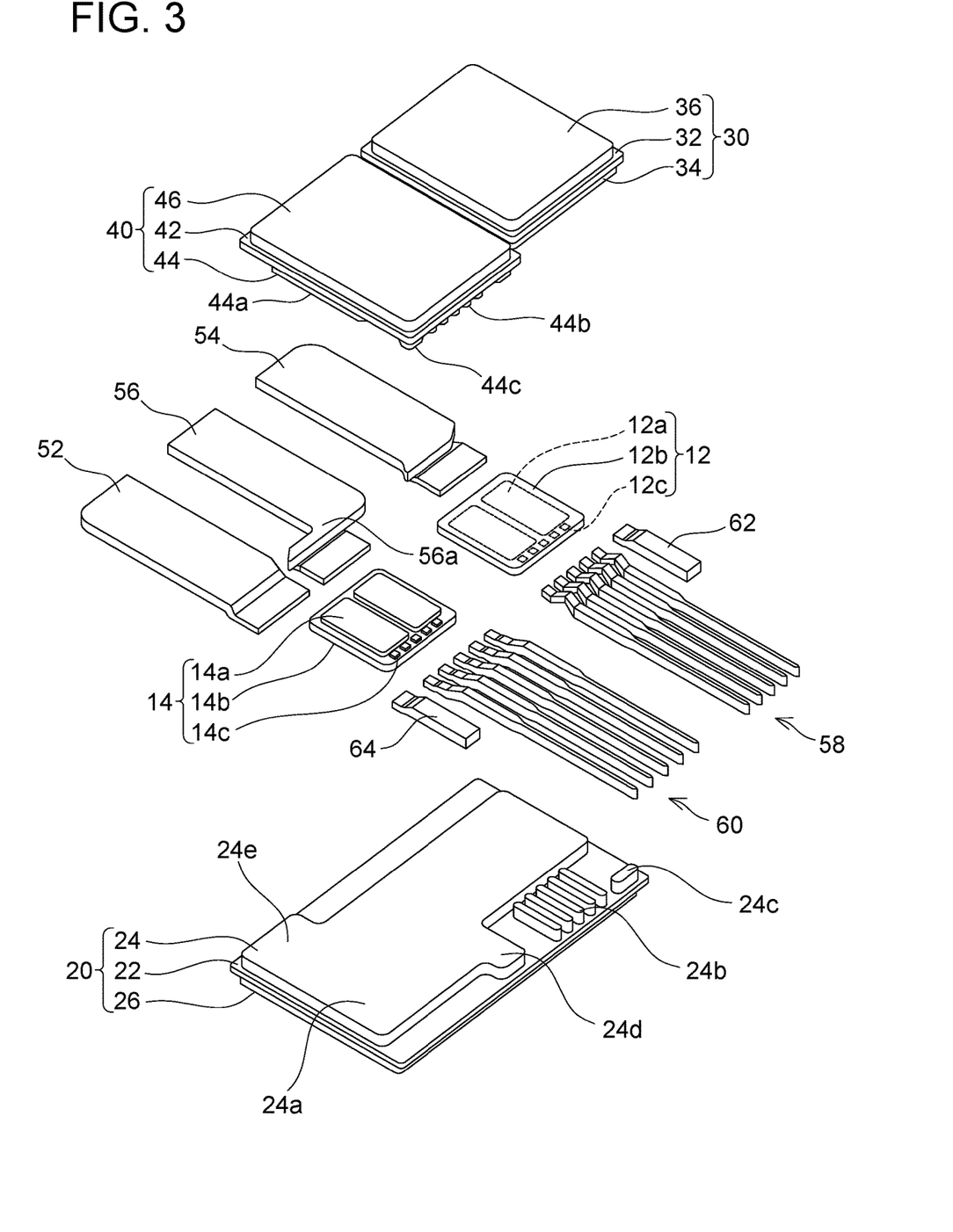
FIG. 3 is an exploded diagram showing an internal structure of the semiconductor device 10 with an encapsulant 16 omitted.

The semiconductor device 10 further includes a first insulated substrate 20, a second insulated substrate 30, and a third insulated substrate 40. The first insulated substrate 20 is larger than the second insulated substrate 30 and the third insulated substrate 40, and both of the first semiconductor chip 12 and the second semiconductor chip 14 are disposed on the first insulated substrate 20. The first insulated substrate 20 includes a first insulator layer 22, a first inner conductor layer 24 provided on one side of the first insulator layer 22, and a first outer conductor layer 26 provided on another side of the first insulator layer 22. The first inner conductor layer 24 is electrically connected to the first semiconductor chip 12 and the second semiconductor chip 14 within the encapsulant 16. On the other hand, the first outer conductor layer 26 is exposed to an outside at the back surface 16b of the encapsulant 16. Due to this, the first insulated substrate 20 constitutes a part of an electric circuit, and additionally, functions as a heat radiator plate that radiates heat of the first semiconductor chip 12 and the second semiconductor chip 14 to outside.

Figure 5:
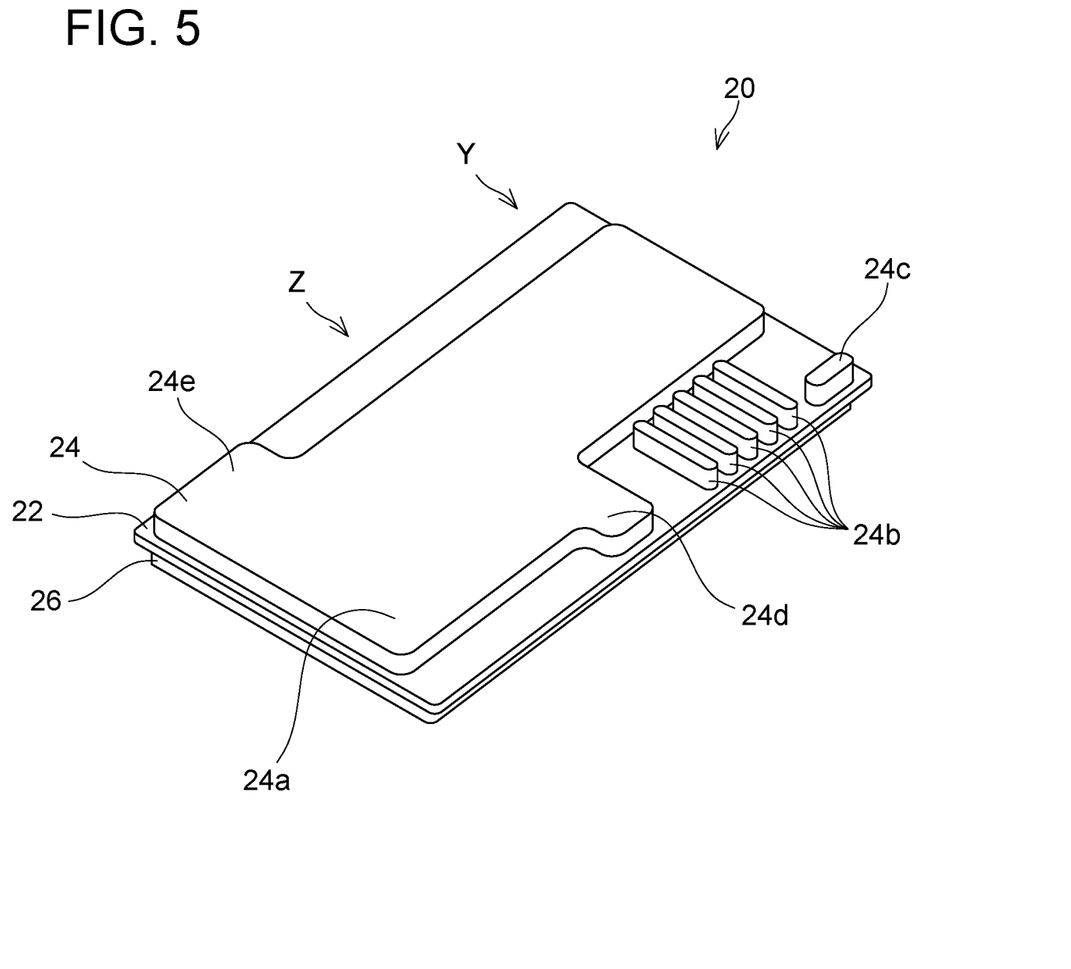
FIG. 5 is a perspective view showing a first inner conductor layer 24 of a first insulated substrate 20.

As shown in FIG. 5, the first inner conductor layer 24 of the first insulated substrate 20 includes a plurality of regions 24a, 24b, 24c that are separated from one another on the first insulator layer 22. The plurality of regions 24a, 24b, 24c includes a main region 24a, a plurality of signal regions 24b, and a floating region 24c. The main region 24a is electrically connected to the front electrode 12a of the first semiconductor chip 12 and the back electrode 14b of the second semiconductor chip 14. Due to this, the first semiconductor chip 12 and the second semiconductor chip 14 are connected to each other via the main region 24a of the first inner conductor layer 24. Each of the plurality of signal regions 24b is electrically connected to corresponding one of the plurality of signal electrodes 12c of the first semiconductor chip 12. As an example, in the present embodiment, the first semiconductor chip 12 and the second semiconductor chip 14 are soldered directly to the first inner conductor layer 24 of the first insulated substrate 20 by solder 15 shown in FIG. 2. As another embodiment, at least one of the first semiconductor chip 12 and the second semiconductor chip 14 may be connected to the first inner conductor layer 24 of the first insulated substrate 20 via a member such as a conductor spacer or a bonding wire.

The floating region 24c is connected to neither of the first semiconductor chip 12 nor the second semiconductor chip 14, and is electrically insulated from the first semiconductor chip 12 and the second semiconductor chip 14. The floating region 24c is located close to an outer edge of the first insulator layer 22 such that the plurality of signal regions 24b is located between the main region 24a and the floating region 24c. Such a floating region 24c suppresses thermal deformation (warpage, in particular) in the first insulated substrate 20. In other words, in the first insulated substrate 20, a reduction in symmetry between the first inner conductor layer 24 and the first outer conductor layer 26 may cause an increase in the thermal deformation (warpage, in particular) in the first insulated substrate 20. In this regard, in a region that includes the plurality of signal regions 24b, the first inner conductor layer 24 (i.e., the signal regions 24b) partly exists, unlike in a region where the main region 24a is provided. Therefore, the symmetry between the first inner conductor layer 24 and the first outer conductor layer 26 is likely to be reduced. However, with the above-described floating region 24c provided, the symmetry between the first inner conductor layer 24 and the first outer conductor layer 26 can be effectively improved, and the thermal deformation in the first insulated substrate 20 can be suppressed.

A position where the floating region 24c provided is not limited to a particular position. In a plan view of the first insulated substrate 20, a part of an outer edge of the floating region 24c may overlap an outer edge of the first outer conductor layer 26. According to such a configuration, the symmetry between the first inner conductor layer 24 and the first outer conductor layer 26 is improved, so the thermal deformation in the first insulated substrate 20 can further be suppressed.

In addition to the floating region 24c, an extending portion 24d that extends parallel to the plurality of signal regions 24b is also provided in the main region 24a. The extending portion 24d is provided on an opposite side to the floating region 24c with respect to the plurality of signal regions 24b. In other words, the plurality of signal regions 24b is located between the floating region 24c and the extending portion 24d of the main region 24a. According to such a configuration, the symmetry between the first inner conductor layer 24 and the first outer conductor layer 26 is further improved, and the thermal deformation in the first insulated substrate 20 can be suppressed.

The second insulated substrate 30 is opposed to the first insulated substrate 20 with the first semiconductor chip 12 interposed therebetween. In other words, the first semiconductor chip 12 is located between the first insulated substrate 20 and the second insulated substrate 30. The second insulated substrate 30 includes a second insulator layer 32, a second inner conductor layer 34 provided on one side of the second insulator layer 32, and a second outer conductor layer 36 provided on another side of the second insulator layer 32. The second inner conductor layer 34 is electrically connected to the first semiconductor chip 12 within the encapsulant 16. On the other hand, the second outer conductor layer 36 is exposed to outside at the front surface 16a of the encapsulant 16. Due to this, the second insulated substrate 30 constitutes a part of an electric circuit, and additionally, functions as a heat radiator plate that radiates heat of the first semiconductor chip 12 to outside.

Figure 6:
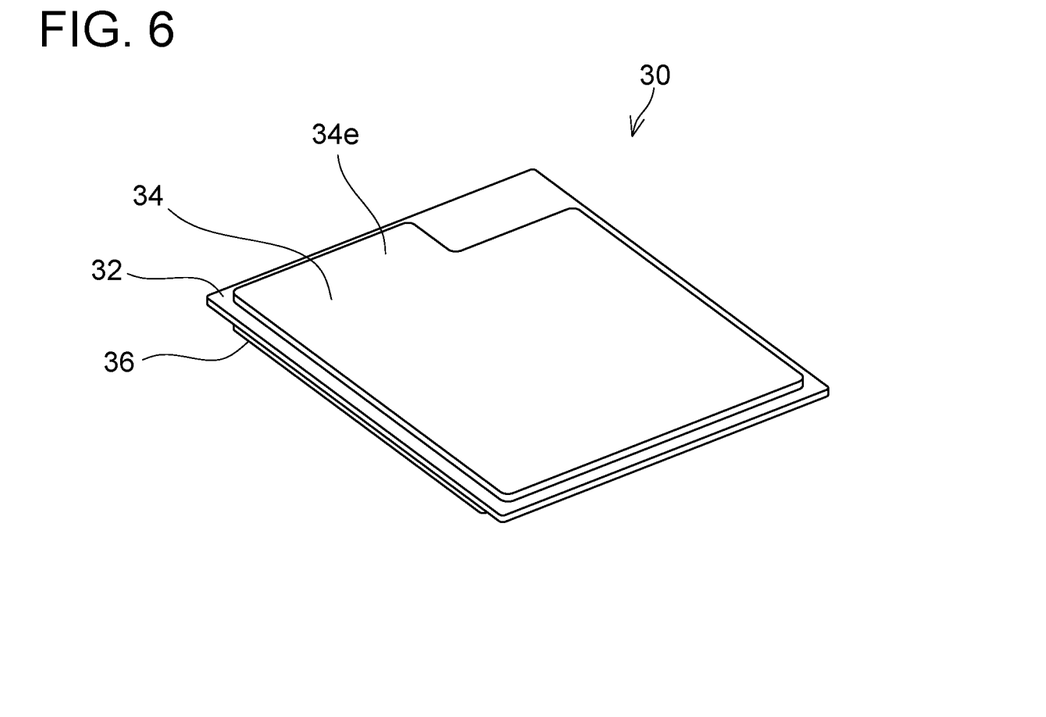
FIG. 6 is a perspective view showing a second inner conductor layer 34 of a second insulated substrate 30.

As shown in FIG. 6, the second inner conductor layer 34 of the second insulated substrate 30 includes only a single region. The single second inner conductor layer 34 is electrically connected to the back electrode 12b of the first semiconductor chip 12. Due to this, the second inner conductor layer 34 of the second insulated substrate 30 is electrically connected to the main region 24a of the first inner conductor layer 24 of the first insulated substrate 20 via the first semiconductor chip 12. As an example, in the present embodiment, the first semiconductor chip 12 is soldered directly to the second inner conductor layer 34 of the second insulated substrate 30 by solder 15 shown in FIG. 2. As another embodiment, the first semiconductor chip 12 may be connected to the second inner conductor layer 34 of the second insulated substrate 30 via a member such as a conductor spacer or a bonding wire. Moreover, the second inner conductor layer 34 of the second insulated substrate 30 may include a plurality of regions that are separated from one another on the second insulator layer 32, similarly to the first inner conductor layer 24 of the first insulated substrate 20.

The third insulated substrate 40 is located side by side with the second insulated substrate 30 and is opposed to the first insulated substrate 20 with the second semiconductor chip 14 interposed therebetween. In other words, the second semiconductor chip 14 is located between the first insulated substrate 20 and the third insulated substrate 40. The third insulated substrate 40 includes a third insulator layer 42, a third inner conductor layer 44 provided on one side of the third insulator layer 42, and a third outer conductor layer 46 provided on another side of the third insulator layer 42. The third inner conductor layer 44 is electrically connected to the second semiconductor chip 14 within the encapsulant 16. On the other hand, the third outer conductor layer 46 is exposed to outside at the front surface 16a of the encapsulant 16. Due to this, the third insulated substrate 40 constitutes a part of an electric circuit, and additionally, functions as a heat radiator plate that radiates heat of the second semiconductor chip 14 to outside. In the present embodiment, a size of the third insulated substrate 40 is larger than a size of the second insulated substrate 30, although not particularly limited so. The size of the third insulated substrate 40 may be the same as the size of the second insulated substrate 30, or may be smaller than the size of the second insulated substrate 30.

Figure 7:
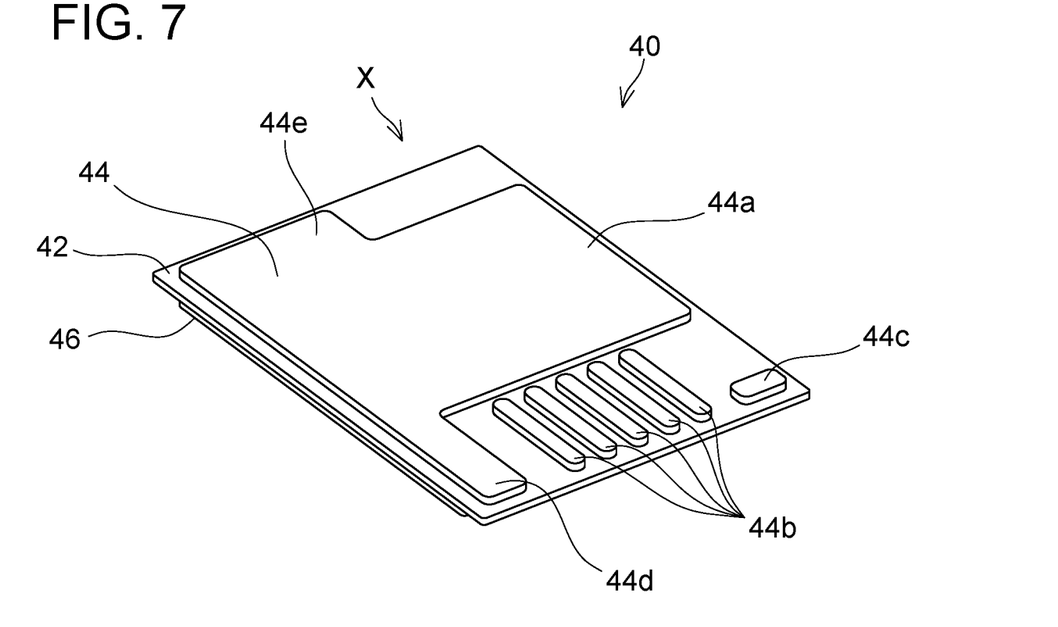
FIG. 7 is a perspective view showing a third inner conductor layer 44 of a third insulated substrate 40.

As shown in FIG. 7, the third inner conductor layer 44 of the third insulated substrate 40 includes a plurality of regions 44a, 44b, 44c that are separated from one another on the third insulator layer 42. The plurality of regions 44a, 44b, 44c includes a main region 44a, a plurality of signal regions 44b, and a floating region 44c. The main region 44a is connected to the front electrode 14a of the second semiconductor chip 14. Due to this, the third inner conductor layer 44 of the third insulated substrate 40 is electrically connected to the main region 24a of the first inner conductor layer 24 of the first insulated substrate 20 via the second semiconductor chip 14. Each of the plurality of signal regions 44b is electrically connected to corresponding one of the plurality of signal electrodes 14c of the second semiconductor chip 14. As an example, in the present embodiment, the second semiconductor chip 14 is soldered directly to the third inner conductor layer 44 of the third insulated substrate 40 by solder 15 shown in FIG. 2. As another embodiment, the second semiconductor chip 14 may be connected to the third inner conductor layer 44 of the third insulated substrate 40 via a member such as a conductor spacer or a bonding wire.

The floating region 44c is connected to neither the first semiconductor chip 12 nor the second semiconductor chip 14, and is electrically insulated from the first semiconductor chip 12 and the second semiconductor chip 14. The floating region 44c is located close to an outer edge of the third insulator layer 42 such that the plurality of signal regions 44b is located between the main region 44a and the floating region 44c. The floating region 44c of the third insulated substrate 40 suppresses thermal deformation (warpage, in particular) in the third insulated substrate 40, in a similar manner to the above-described first insulated substrate 20. The floating region 44c of the third insulated substrate 40 is provided at a position that is vertically and horizontally symmetric with respect to the floating region 24c of the first insulated substrate 20. Moreover, in the third insulated substrate 40 as well, an extending portion 44d that extends parallel to the plurality of signal regions 44b is also provided in the main region 44a of the third inner conductor layer 44. The extending portion 44d of the third insulated substrate 40 can suppress the thermal deformation of the third insulated substrate 40, in a similar manner to the extending portion 24d of the first insulated substrate 20 (see FIG. 5).

As an example, each of the three insulated substrates 20, 30, 40 in the present embodiment is a Direct Bonded Copper (DBC) substrate. The insulator layers 22, 32, 42 are constituted of ceramic, such as aluminum oxide, silicon nitride, or aluminum nitride. Moreover, the inner conductor layers 24, 34, 44 and the outer conductor layers 26, 36, 46 are constituted of copper. Each of the three insulated substrates 20, 30, 40 is not limited to a DBC substrate, and may be, for example, a Direct Bonded Aluminum (DBA) substrate. Alternatively, each of the insulator layers 22, 32, 42 may have a structure different from that of a DBC substrate or a DBA substrate. A configuration of each of the insulated substrates 20, 30, 40 is not particularly limited. The three insulated substrates 20, 30, 40 only need to respectively include the insulator layers 22, 32, 42 constituted of an insulating material, and the inner conductor layers 24, 34, 44 and the outer conductor layers 26, 36, 46 constituted of a conductor such as metal.

Figure 1:
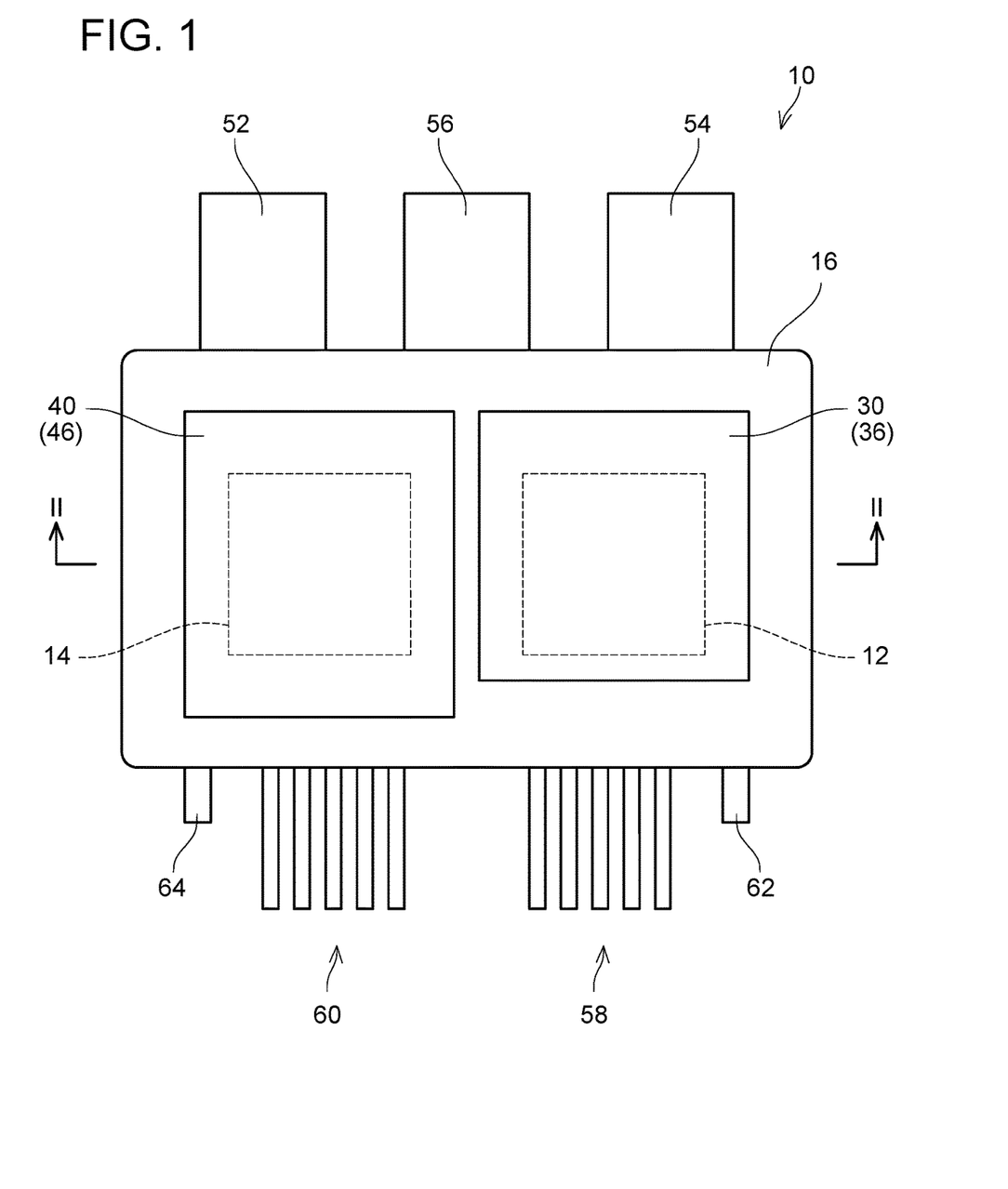
FIG. 1 shows an external view of a semiconductor device 10 in an embodiment.
Figure 4:
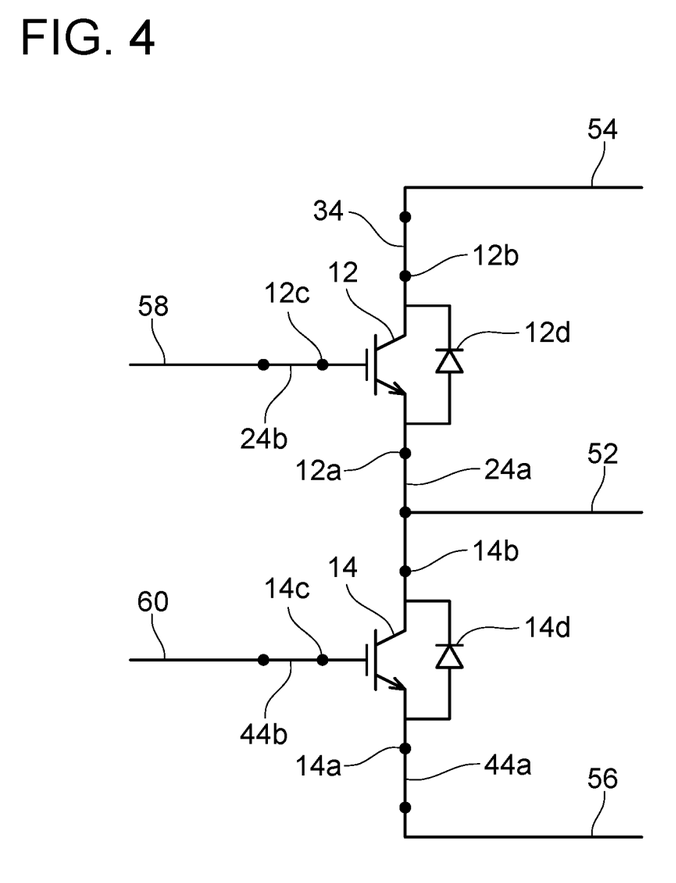
FIG. 4 is a circuit diagram showing a circuit structure of the semiconductor device 10.

As shown in FIGS. 1, 3, and 4, the semiconductor device 10 further includes a first power terminal 52, a second power terminal 54, and a third power terminal 56. These three power terminals 52, 54, 56 protrude from the encapsulant 16 in a same direction and extend parallel to one another. The three power terminals 52, 54, 56 are constituted of a conductor such as copper or another metal. In a stage of manufacturing the semiconductor device 10, the three power terminals 52, 54, 56 may be prepared on a single lead frame, although not particularly limited so.

The first power terminal 52 is electrically connected to the first insulated substrate 20 within the encapsulant 16. Specifically, the first power terminal 52 is joined on the main region 24a of the first inner conductor layer 24 of the first insulated substrate 20 between the first insulated substrate 20 and the third insulated substrate 40. Due to this, the first power terminal 52 is electrically connected to the front electrode 12a of the first semiconductor chip 12 and the back electrode 14b of the second semiconductor chip 14 via the main region 24a of the first inner conductor layer 24. As shown in FIG. 5, in the main region 24a of the first inner conductor layer 24, a portion 24e on which the first power terminal 52 is to be joined is provided to protrude with respect to other portions. On the other hand, as shown in FIG. 7, the third inner conductor layer 44 is not provided within a region X of the third insulated substrate 40 that is opposed to the first power terminal 52. According to such a configuration, the first power terminal 52 and the third inner conductor layer 44 of the third insulated substrate 40 are not brought close to each other, and thus a short circuit between the first power terminal 52 and the third inner conductor layer 44 can be avoided.

The second power terminal 54 is electrically connected to the second insulated substrate 30 within the encapsulant 16. Specifically, the second power terminal 54 is joined on the second inner conductor layer 34 of the second insulated substrate 30 between the first insulated substrate 20 and the second insulated substrate 30. Due to this, the second power terminal 54 is electrically connected to the back electrode 12b of the first semiconductor chip 12 via the second inner conductor layer 34. As shown in FIG. 6, in the second inner conductor layer 34, a portion 34e on which the second power terminal 54 is to be joined is provided to protrude with respect to other portions. On the other hand, as shown in FIG. 5, the first inner conductor layer 24 is not provided within a region Y of the first insulated substrate 20 that is opposed to the second power terminal 54. According to such a configuration, the second power terminal 54 and the first inner conductor layer 24 of the first insulated substrate 20 are not brought close to each other, and thus a short circuit between the second power terminal 54 and the first inner conductor layer 24 can be avoided.

The third power terminal 56 is electrically connected to the third insulated substrate 40 within the encapsulant 16. Specifically, the third power terminal 56 is joined on the third inner conductor layer 44 of the third insulated substrate 40 between the first insulated substrate 20 and the third insulated substrate 40. Due to this, the third power terminal 56 is electrically connected to the front electrode 14a of the second semiconductor chip 14 via the third inner conductor layer 44. As shown in FIG. 7, in the main region 44a of the third inner conductor layer 44, a portion 44e on which the third power terminal 56 is to be joined is provided to protrude with respect to other portions. On the other hand, as shown in FIG. 5, the first inner conductor layer 24 is not provided within a region Z of the first insulated substrate 20 that is opposed to the third power terminal 56. According to such a configuration, the third power terminal 56 and the first inner conductor layer 24 of the first insulated substrate 20 are not brought close to each other, and thus a short circuit between the third power terminal 56 and the first inner conductor layer 24 can be avoided.

The third power terminal 56 includes a bending portion 56a bending along a direction parallel to the third insulated substrate 40. The bending portion 56a is located within the encapsulant 16, and the third power terminal 56 is firmly fixed by its anchor effect. A similar bending portion can also be adopted for other terminals such as the first power terminal 52 and the second power terminal 54. Moreover, each of the three power terminals 52, 54, 56 is also bent in its thickness direction. According to such a configuration, each of the power terminals 52, 54, 56 easily extend and contract according to thermal deformation of the encapsulant 16, so loads that act on joint portions between the power terminals 52, 54, 56 and the inner conductor layers 24, 34, 44 can be mitigated.

As shown in FIGS. 1, 3, and 4, the semiconductor device 10 further includes a plurality of first signal terminals 58 and a plurality of second signal terminals 60. These signal terminals 58, 60 protrude from the encapsulant 16 in a same direction and extend parallel to one another. The signal terminals 58, 60 are constituted of a conductor such as copper or another metal.

The plurality of first signal terminals 58 is electrically connected to the first insulated substrate 20 within the encapsulant 16. Specifically, each of the plurality of first signal terminals 58 is joined on corresponding one of the plurality of signal regions 24b of the first inner conductor layer 24 of the first insulated substrate 20 (see FIG. 5). Due to this, the plurality of first signal terminals 58 is electrically connected to the plurality of signal electrodes 12c of the first semiconductor chip 12 via the plurality of signal regions 24b of the first inner conductor layer 24. As an example, in the present embodiment, the plurality of first signal terminals 58 is soldered directly to the plurality of signal regions 24b of the first inner conductor layer 24. As another embodiment, the plurality of first signal terminals 58 may be connected to the plurality of signal regions 24b (or the plurality of signal electrodes 12c of the first semiconductor chip 12) via members such as conductor spacers or bonding wires.

The plurality of second signal terminals 60 is electrically connected to the third insulated substrate 40 within the encapsulant 16. Specifically, each of the plurality of second signal terminals 60 is joined on corresponding one of the plurality of sisal regions 44b of the third inner conductor layer 44 of the third insulated substrate 40 (see FIG. 7). Due to this, the plurality of second signal terminals 60 is electrically connected to the plurality of signal electrodes 14c of the second semiconductor chip 14 via the plurality of signal regions 44b of the third inner conductor layer 44. As an example, in the present embodiment, the plurality of second signal terminals 60 is soldered directly to the plurality of signal regions 44b of the third inner conductor layer 44. As another embodiment, the plurality of second signal terminals 60 may be connected to the plurality of signal regions 44b (or the plurality of signal electrodes 14c of the second semiconductor chip 14) via members such as conductor spacers or bonding wires.

The semiconductor device 10 further includes two dummy terminals 62, 64. Each of the dummy terminals 62, 64 protrudes in the same direction as that of the plurality of signal terminals 58, 60. One of the dummy terminals, namely, the dummy terminal 62, is joined on the floating region 24c of the first inner conductor layer 24 of the first insulated substrate 20. The other of the dummy terminals, namely, the dummy terminal 64, is joined on the floating region 44c of the third inner conductor layer 44 of the third insulated substrate 40. As an example, in a stage of manufacturing the semiconductor device 10, the two dummy terminals 62, 64 are prepared, together with the plurality of signal terminals 58, 60, on a same lead frame. Joining the two dummy terminals 62, 64 on the floating regions 24c, 44c accurately positions the lead frame that includes the plurality of signal terminals 58, 60 with respect to the first insulated substrate 20 and the third insulated substrate 40.

As described above, in the semiconductor device 10 in the present embodiment, the first semiconductor chip 12 and the second semiconductor chip 14 are connected in series between the second insulated substrate 30 and the third insulated substrate 40. The first semiconductor chip 12 and the second semiconductor chip 14 are connected via the first inner conductor layer 24 of the first insulated substrate 20, and there is no other insulated substrate or power terminal on a path that connects the two semiconductor chips 12, 14. Accordingly, the circuit structure in the semiconductor device 10 is simplified, and a power loss in the semiconductor device 10 can be reduced, for example. The second insulated substrate 30 and the third insulated substrate 40, which are located side by side, may be replaced with a single insulated substrate. However, since a relatively large voltage could be applied between the second insulated substrate 30 and the third insulated substrate 40, adopting the second insulated substrate 30 and the third insulated substrate 40 that are independent of each other can more effectively enhance insulation.

What is claimed is:
1. A semiconductor device comprising:
a first insulated substrate;
a first semiconductor chip and a second semiconductor chip disposed on the first insulated substrate;
a second insulated substrate opposed to the first insulated substrate with the first semiconductor chip interposed therebetween; and
a third insulated substrate opposed to the first insulated substrate with the second semiconductor chip interposed therebetween and located side by side with the second insulated substrate,
wherein
the first insulated substrate comprises a first insulator layer, a first inner conductor layer provided on one side of the first insulator layer and electrically connected to the first semiconductor chip and the second semiconductor chip, and a first outer conductor layer provided on another side of the first insulator layer,
the second insulated substrate comprises a second insulator layer, a second inner conductor layer provided on one side of the second insulator layer and electrically connected to the first semiconductor chip, and a second outer conductor layer provided on another side of the second insulator layer,
the third insulated substrate comprises a third insulator layer, a third inner conductor layer provided on one side of the third insulator layer and electrically connected to the second semiconductor chip, and a third outer conductor layer provided on another side of the third insulator layer,
each of the first semiconductor chip and the second semiconductor chip is a switching element comprising a front electrode and a back electrode and configured to electrically connect and disconnect the front electrode and the back electrode,
the front electrode of the first semiconductor chip is electrically connected to the first inner conductor layer of the first insulated substrate,
the back electrode of the first semiconductor chip is electrically connected to the second inner conductor layer of the second insulated substrate,
the front electrode of the second semiconductor chip is electrically connected to the third inner conductor layer of the third insulated substrate,
the back electrode of the second semiconductor chip is electrically connected to the first inner conductor layer of the first insulated substrate, each of the switching elements is an Insulated Gate Bipolar Transistor (IGBT),
the front electrode is an emitter electrode, and
the back electrode is a collector electrode.

2. The semiconductor device according to claim 1, wherein a size of the second insulated substrate is different from a size of the third insulated substrate.

3. The semiconductor device according to claim 2, wherein the size of the second insulated substrate is smaller than the size of the third insulated substrate.

4. The semiconductor device according to claim 2, wherein the size of the second insulated substrate is larger than the size of the third insulated substrate.

5. The semiconductor device according to claim 1, further comprising:
an encapsulant encapsulating the first semiconductor chip and the second semiconductor chip,
wherein the first inner conductor layer of the first insulated substrate is soldered directly to the first semiconductor chip and the second semiconductor chip,
the second inner conductor layer of the second insulated substrate is soldered directly to the first semiconductor chip, and
the third inner conductor layer of the third insulated substrate is soldered directly to the second semiconductor chip.

6. A semiconductor device comprising:
a first insulated substrate;
a first semiconductor chip and a second semiconductor chip disposed on the first insulated substrate;
a second insulated substrate opposed to the first insulated substrate with the first semiconductor chip interposed therebetween; and
a third insulated substrate opposed to the first insulated substrate with the second semiconductor chip interposed therebetween and located side by side with the second insulated substrate,
wherein
the first insulated substrate comprises a first insulator layer, a first inner conductor layer provided on one side of the first insulator layer and electrically connected to the first semiconductor chip and the second semiconductor chip, and a first outer conductor layer provided on another side of the first insulator layer,
the second insulated substrate comprises a second insulator layer, a second inner conductor layer provided on one side of the second insulator layer and electrically connected to the first semiconductor chip, and a second outer conductor layer provided on another side of the second insulator layer,
the third insulated substrate comprises a third insulator layer, a third inner conductor layer provided on one side of the third insulator layer and electrically connected to the second semiconductor chip, and a third outer conductor layer provided on another side of the third insulator layer,
each of the first semiconductor chip and the second semiconductor chip is a switching element comprising a front electrode and a back electrode and configured to electrically connect and disconnect the front electrode and the back electrode,
the front electrode of the first semiconductor chip is electrically connected to the first inner conductor layer of the first insulated substrate,
the back electrode of the first semiconductor chip is electrically connected to the second inner conductor layer of the second insulated substrate,
the front electrode of the second semiconductor chip is electrically connected to the third inner conductor layer of the third insulated substrate,
the back electrode of the second semiconductor chip is electrically connected to the first inner conductor layer of the first insulated substrate,
each of the switching elements is a Metal-Oxide-Semiconductor Field-Effect Transistor (MOSFET),
the front electrode is a source electrode, and
the back electrode is a drain electrode.

7. A semiconductor device comprising:
a first insulated substrate;
a first semiconductor chip and a second semiconductor chip disposed on the first insulated substrate;
a second insulated substrate opposed to the first insulated substrate with the first semiconductor chip interposed therebetween; and
a third insulated substrate opposed to the first insulated substrate with the second semiconductor chip interposed therebetween and located side by side with the second insulated substrate,
wherein
the first insulated substrate comprises a first insulator layer, a first inner conductor layer provided on one side of the first insulator layer and electrically connected to the first semiconductor chip and the second semiconductor chip, and a first outer conductor layer provided on another side of the first insulator layer,
the second insulated substrate comprises a second insulator layer, a second inner conductor layer provided on one side of the second insulator layer and electrically connected to the first semiconductor chip, and a second outer conductor layer provided on another side of the second insulator layer,
the third insulated substrate comprises a third insulator layer, a third inner conductor layer provided on one side of the third insulator layer and electrically connected to the second semiconductor chip, and a third outer conductor layer provided on another side of the third insulator layer,
each of the first semiconductor chip and the second semiconductor chip is a switching element comprising a front electrode and a back electrode and configured to electrically connect and disconnect the front electrode and the back electrode,
the front electrode of the first semiconductor chip is electrically connected to the first inner conductor layer of the first insulated substrate,
the back electrode of the first semiconductor chip is electrically connected to the second inner conductor layer of the second insulated substrate,
the front electrode of the second semiconductor chip is electrically connected to the third inner conductor layer of the third insulated substrate,
the back electrode of the second semiconductor chip is electrically connected to the first inner conductor layer of the first insulated substrate,
each of the first semiconductor chip and the second semiconductor chip further comprises a signal electrode provided on a side thereof where the front electrode is provided,
the first inner conductor layer of the first insulated substrate comprises a main region and a signal region that are separated from each other on the first insulator layer, the main region is electrically connected to the front electrode of the first semiconductor chip and the back electrode of the second semiconductor chip, and the signal region is electrically connected to the signal electrode of the first semiconductor chip.

8. The semiconductor device according to claim 7, wherein the first inner conductor layer of the first insulated substrate further comprises a floating region electrically insulated from the first semiconductor chip and the second semiconductor chip, and the floating region is located close to an outer edge of the first insulator layer such that the signal region is located between the main region and the floating region.

9. The semiconductor device according to claim 8, wherein a dummy terminal is joined on the floating region.

10. The semiconductor device according to claim 8, wherein in a plan view of the first insulated substrate, a part of an outer edge of the floating region overlaps an outer edge of the first outer conductor layer.

11. The semiconductor device according to claim 7, wherein the third inner conductor layer of the third insulated substrate comprises a main region and a signal region that are separated from each other on the third insulator layer, the main region of the third inner conductor layer is electrically connected to the front electrode of the second semiconductor chip, and the signal region of the third inner conductor layer is electrically connected to the signal electrode of the second semiconductor chip.

12. The semiconductor device according to claim 11, wherein the third inner conductor layer of the third insulated substrate further comprises a floating region electrically insulated from the first semiconductor chip and the second semiconductor chip, and in the third insulated substrate, the floating region is located close to an outer edge of the third insulator layer such that the signal region is located between the main region and the floating region.

13. The semiconductor device according to claim 1, further comprising:

a first power terminal joined on the first inner conductor layer of the first insulated substrate between the first insulated substrate and the third insulated substrate, wherein the third inner conductor layer is not provided within a region of the third insulated substrate that is opposed to the first power terminal.

14. The semiconductor device according to claim 1, further comprising:

a second power terminal joined on the second inner conductor layer of the second insulated substrate between the first insulated substrate and the second insulated substrate, wherein the first inner conductor layer is not provided within a region of the first insulated substrate that is opposed to the second power terminal.

15. The semiconductor device according to claim 1, further comprising:

a third power terminal joined on the third inner conductor layer of the third insulated substrate between the first insulated substrate and the third insulated substrate, wherein the first inner conductor layer is not provided within a region of the first insulated substrate that is opposed to the third power terminal.

16. The semiconductor device according to claim 15, wherein the third power terminal includes a bending portion bending along a direction parallel to the third insulated substrate.

* * * * *